United States Patent
Jeong et al.

(10) Patent No.: US 7,890,844 B2
(45) Date of Patent: Feb. 15, 2011

(54) APPARATUS AND METHOD FOR TRANSMITTING/RECEIVING SIGNAL IN A COMMUNICATION SYSTEM USING LOW DENSITY PARITY CHECK CODE

(75) Inventors: Hong-Sil Jeong, Seoul (KR); Sung-Eun Park, Seoul (KR); Seung-Hoon Choi, Suwon-si (KR); Dong-Seek Park, Yongin-si (KR); Chi-Woo Lim, Suwon-si (KR); Gyu-Bum Kyung, Suwon-si (KR); Jae-Yoel Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 1175 days.

(21) Appl. No.: 11/528,044

(22) Filed: Sep. 27, 2006

(65) Prior Publication Data
US 2007/0089027 A1  Apr. 19, 2007

(30) Foreign Application Priority Data
Sep. 27, 2005  (KR) ........................ 10-2005-0089962

(51) Int. Cl.
*H03M 13/00* (2006.01)
(52) U.S. Cl. .................. 714/784; 714/758; 714/776
(58) Field of Classification Search .................. 714/784, 714/752, 758, 755, 781, 776
See application file for complete search history.

(56) References Cited

U.S. PATENT DOCUMENTS

| 7,506,238 | B2 * | 3/2009 | Hocevar ...................... 714/781 |
| 7,519,895 | B2 | 4/2009 | Kyung et al. |
| 7,526,717 | B2 | 4/2009 | Kyung et al. |
| 2004/0098659 | A1 * | 5/2004 | Bjerke et al. ................. 714/776 |
| 2005/0060635 | A1 * | 3/2005 | Eroz et al. ................... 714/801 |
| 2005/0283709 | A1 | 12/2005 | Kyung et al. |

FOREIGN PATENT DOCUMENTS

| KR | 1020050046468 | 5/2005 |
| KR | 1020060048403 | 5/2006 |

* cited by examiner

*Primary Examiner*—Fritz Alphonse
(74) *Attorney, Agent, or Firm*—The Farrell Law Firm, LLP

(57) ABSTRACT

An apparatus is provided for transmitting a signal in a communication system using a Low Density Parity Check (LDPC) code. A controller determines a number of '0's to be inserted in information data according to a first coding rate to be applied when generating the information data into an LDPC code, and determines the number of '0's to be removed from the LDPC code. A '0' inserter inserts '0s' in the information data according to control of the controller. An LDPC encoder generates the LDPC code by encoding the '0'-inserted signal according to a first parity check matrix. A '0' remover removes the inserted '0's from the LDPC code.

18 Claims, 11 Drawing Sheets

| $P^a{}_{11}$ | $P^a{}_{12}$ | $P^a{}_{13}$ | $P^a{}_{14}$ | ... | $P^a{}_{1(q-1)}$ | $P^a{}_{1q}$ |
|---|---|---|---|---|---|---|
| $P^a{}_{21}$ | $P^a{}_{22}$ | $P^a{}_{23}$ | $P^a{}_{24}$ | ... | $P^a{}_{2(q-1)}$ | $P^a{}_{2q}$ |
| $P^a{}_{31}$ | $P^a{}_{32}$ | $P^a{}_{33}$ | $P^a{}_{34}$ | ... | $P^a{}_{3(q-1)}$ | $P^a{}_{3q}$ |
| ⋮ | ⋮ | ⋮ | ⋮ | ... | ⋮ | ⋮ |
| $P^a{}_{p1}$ | $P^a{}_{p2}$ | $P^a{}_{p3}$ | $P^a{}_{p4}$ | ... | $P^a{}_{p(q-1)}$ | $P^a{}_{pq}$ |

FIG.4

(PRIOR ART)

FIG. 8

| | | | | | | | | | | | |
|---|---|---|---|---|---|---|---|---|---|---|---|
| -1 | -1 | -1 | -1 | -1 | -1 | -1 | -1 | -1 | -1 | 0 | 0 |
| -1 | -1 | -1 | -1 | -1 | -1 | -1 | -1 | -1 | 0 | 0 | -1 |
| -1 | -1 | -1 | -1 | -1 | -1 | -1 | -1 | 0 | 0 | -1 | -1 |
| -1 | -1 | -1 | -1 | -1 | -1 | -1 | 0 | 0 | -1 | -1 | -1 |
| -1 | -1 | -1 | -1 | -1 | -1 | 0 | 0 | -1 | -1 | -1 | -1 |
| -1 | -1 | -1 | -1 | -1 | 0 | 0 | -1 | -1 | -1 | -1 | -1 |
| -1 | -1 | -1 | -1 | 0 | 0 | -1 | -1 | -1 | -1 | -1 | -1 |
| -1 | -1 | -1 | 0 | 0 | -1 | -1 | -1 | -1 | -1 | -1 | -1 |
| -1 | -1 | 0 | 0 | -1 | -1 | -1 | -1 | -1 | -1 | -1 | -1 |
| -1 | 0 | 0 | -1 | -1 | -1 | -1 | -1 | -1 | -1 | -1 | -1 |
| 0 | 0 | -1 | -1 | -1 | -1 | -1 | -1 | -1 | -1 | -1 | -1 |
| -1 | -1 | -1 | -1 | 0 | -1 | -1 | -1 | -1 | -1 | -1 | -1 |
| -1 | -1 | 0 | -1 | -1 | -1 | 27 | -1 | 30 | -1 | -1 | -1 |
| -1 | -1 | -1 | 0 | -1 | -1 | -1 | 18 | -1 | -1 | -1 | -1 |
| 0 | -1 | 38 | 41 | 2 | 8 | 35 | 25 | -1 | 17 | -1 | -1 |
| -1 | 0 | -1 | -1 | -1 | 40 | -1 | -1 | -1 | 15 | -1 | -1 |
| -1 | -1 | -1 | 0 | -1 | -1 | 13 | -1 | -1 | -1 | -1 | 8 |
| -1 | 0 | 17 | -1 | 35 | 22 | 18 | 27 | 16 | -1 | -1 | 18 |
| 0 | -1 | -1 | -1 | 20 | -1 | -1 | -1 | -1 | -1 | 14 | -1 |
| -1 | -1 | 0 | -1 | -1 | -1 | -1 | -1 | -1 | 4 | -1 | 21 |
| 0 | 26 | 21 | 30 | -1 | -1 | 9 | -1 | 29 | 4 | 19 | -1 |
| -1 | 0 | -1 | -1 | -1 | -1 | -1 | 44 | -1 | -1 | -1 | -1 |
| 0 | -1 | -1 | -1 | -1 | 46 | -1 | -1 | 35 | -1 | -1 | -1 |
| 0 | 29 | -1 | 43 | 5 | -1 | -1 | 2 | 33 | -1 | 5 | 10 |

FIG.9

APPARATUS AND METHOD FOR TRANSMITTING/RECEIVING SIGNAL IN A COMMUNICATION SYSTEM USING LOW DENSITY PARITY CHECK CODE

PRIORITY

This application claims the benefit under 35 U.S.C. §119(a) of an application filed in the Korean Intellectual Property Office on Sep. 27, 2005 and assigned Serial No. 2005-89962, the contents of which are incorporated herein by reference.

BACKGROUND OF THE INVENTION

1. Field of the Invention

The present invention relates generally to an apparatus and method for transmitting/receiving signals in a communication system, and in particular, to an apparatus and method for transmitting/receiving signals in a communication system using Low Density Parity Check (LDPC) codes.

2. Description of the Related Art

Due to the rapid development of mobile communication systems, there is a need for technology capable of transmitting bulk data approximating the capacity of a wire network even in a wireless network. To meet the increasing demand for a high-speed, high-capacity communication system capable of processing and transmitting various data such as video and wireless data beyond the voice-oriented service, it is essential to increase system transmission efficiency using an appropriate channel coding scheme in order to improve the system performance. However, due to the characteristics of the mobile communication system, it inevitably incurs error during data transmission due to noises, interference and fading according to channel conditions. The error causes a loss of information data.

Accordingly, various error control schemes are used according to channel characteristics in order to improve reliability of the mobile communication system. The most typical error control scheme uses error correction codes.

FIG. 1 is a diagram illustrating a structure of a transceiver in a conventional mobile communication system.

Referring to FIG. 1, a transmitter 100 includes an encoder 111, a modulator 113 and a radio frequency (RF) processor 115, and a receiver 150 includes an RF processor 151, a demodulator 153 and a decoder 155.

In the transmitter 100, transmission information data 'u', if generated, is delivered to the encoder 111. The encoder 111 generates a coded symbol 'c' by coding the information data 'u' with a coding scheme, and outputs the coded symbol 'c' to the modulator 113. The modulator 113 generates a modulation symbol 's' by modulating the coded symbol 'c' with a modulation scheme, and outputs the modulation symbol 's' to the RF processor 115. The RF processor 115 RF-processes the modulation symbol 's' output from the modulator 113, and transmits the RF-processed signal to the receiver 150 via an antenna.

The signal transmitted by the transmitter 100 in this manner is received at the receiver 150 via an antenna, and the signal received via the antenna is delivered to the RF processor 151. The RF processor 151 RF-processes the received signal, and outputs the RF-processed signal 'r' to the demodulator 153. The demodulator 153 demodulates the RF-processed signal 'r' output from the RF processor 151 using a demodulation scheme corresponding to the modulation scheme applied in the modulator 113 of the transmitter 100, and outputs the demodulated signal 'x' to the decoder 155.

The decoder 155 decodes the demodulated signal 'x' output from the demodulator 153 using a decoding scheme corresponding to the coding scheme applied in the encoder 111 of the transmitter 100, and outputs the decoded signal 'û' as finally decoded information data.

In order for the receiver 150 to decode the information data 'u' transmitted by the transmitter 100 without errors, there is a need for high-performance encoder and decoder. Particularly, because a radio channel environment should be taken into consideration because of the characteristics of a mobile communication system, errors that can be generated due to the radio channel environment should be considered more seriously.

The most typical error correction codes include turbo codes and LDPC codes.

It is well known that the LDPC code is superior in performance gain to a convolutional code conventionally used for error correction, during high-speed data transmission. The LDPC code is advantageous in that it can efficiently correct an error caused by noises generated in a transmission channel, thereby increasing reliability of the data transmission. In addition, the LDPC code can be decoded using an iterative decoding algorithm base on a sum-product algorithm in a factor graph. Because a decoder for the LDPC code uses the sum-product algorithm-based iterative decoding algorithm, it is less complex than a decoder for the turbo code. In addition, the decoder for the LDPC code is easy to implement with a parallel processing decoder, as compared with the decoder for the turbo code.

The turbo code has good performance approximating a channel capacity limit of Shannon's channel coding theorem, and the LDPC code shows performance having a difference of only about 0.04 (dB) at the channel capacity limit of Shannon's channel coding theorem at a bit error rate (BER) $10^{-5}$, using a block size $10^7$. Shannon's channel coding theorem shows that reliable communication is possible only at a data rate not exceeding a channel capacity. However, Shannon's channel coding theorem has proposed no detailed channel coding/decoding method for supporting a data rate up to the maximum channel capacity limit. Generally, although a random code having a very large block size shows performance approximating the channel capacity limit of Shannon's channel coding theorem, when a MAP (Maximum A Posteriori) or ML (Maximum Likelihood) decoding method is used, it is impossible to implement the decoding method because of its heavy calculation load.

Meanwhile, if the LDPC code is expressed with a factor graph, cycles exist in the factor graph, and it is well known that iterative decoding in the factor graph of the LDPC code where cycles exist is not preferred. Also, it has been experimentally proven that the LDPC code has excellent performance through iterative decoding. However, when there are too many short-length cycles in the factor graph, performance degradation is expected. Therefore, continuous research is being conducted to design an LDPC code where there is no short-length cycle.

The LDPC code, proposed by Gallager, is defined by a parity check matrix in which major elements have a value of 0 and minor elements except for the elements having the value of 0 have a non-zero value, e.g., a value of 1. For convenience, it will be assumed herein that a non-zero value is a value of 1.

Because a parity check matrix of the LDPC code has a very small weight, even a block code having a relatively long length can be decoded through iterative decoding. When a block length of its block code is continuously increased, the LPDC code exhibits performance approximating the channel capacity limit of Shannon's channel coding theorem, like the turbo code. Therefore, the next generation communication system tends to positively use the LDPC code as the error correction code.

An LDPC code in which a weight of each column in the parity check matrix is fixed to 'j' and a weight of each row in the parity check matrix is fixed to 'k' as described above, is called a "regular LDPC code." Herein, the "weight" refers to the number of elements having a non-zero value among the elements constituting the parity check matrix. On the contrary, an LDPC code in which the weight of each column in the parity check matrix and the weight of each row in the parity check matrix are not fixed is called an "irregular LDPC code."

FIG. 2 is a diagram illustrating a parity check matrix of a conventional (8, 2, 4) LDPC code.

Referring to FIG. 2, a parity check matrix H of the (8, 2, 4) LDPC code is composed of 8 columns and 4 rows, wherein a weight of each column is fixed to 2 and a weight of each row is fixed to 4. Because the weight of each column and the weight of each row in the parity check matrix are regular as stated above, the (8, 2, 4) LDPC code shown in FIG. 2 is a regular LDPC code.

FIG. 3 is a diagram illustrating a factor graph of the (8, 2, 4) LDPC code of FIG. 2.

Referring to FIG. 3, the factor graph of the (8, 2, 4) LDPC code is composed of 8 variable nodes of $x_1$ 300, $x_2$ 302, $x_3$ 304, $x_4$ 306, $x_5$ 308, $x_6$ 310, $x_7$ 312 and $x_8$ 314, and 4 check nodes 316, 318, 320 and 322. When an element having a value of 1, i.e., a non-zero value, exists at a point where an $i^{th}$ row and a $j^{th}$ column of the parity check matrix of the (8, 2, 4) LDPC code cross each other, a branch is created between a variable node $x_i$ and a $j^{th}$ check node.

Because the parity check matrix of the LDPC code has a very small weight as described above, iterative decoding is possible even in a block code having a relatively long length. If a block length of the block code is continuously increased, the LDPC code exhibits performance approximating the channel capacity limit of Shannon's channel coding theorem, like the turbo code. In addition, MacKay and Neal have proven that an iterative decoding process of an LDPC code using a flow transfer scheme is approximate to an iterative decoding process of the turbo code in performance.

In order to generate a high-performance LDPC code, the following conditions should be satisfied.

(1) Cycles on a Factor Graph of an LDPC Code Should be Considered.

The term "cycle" refers to a closed loop that never passes through any node more than twice in the factor graph of the LDPC code. An increase in the number of short-length cycles causes performance degradation, such as error floor. Therefore, an increase in length of the cycles generated in the factor graph of the LDPC code contributes to performance improvement of the LDPC code.

(2) Degree Distribution on a Factor Graph of an LDPC Code Should be Considered.

Generally, an irregular LDPC code is superior in performance to a regular LDPC code, because a weight of each row and a weight of each column in the parity check matrix are not constant, i.e. because nodes of the irregular block LDPC code have various degrees. The term "degree" refers to the number of edges connected to the variable nodes and the check nodes in the factor graph of the LDPC code. Further, the term "degree distribution" refers to a ratio of the number of nodes having a particular degree to the total number of nodes. It has been proven by Richardson et al. that a high-performance LDPC code should have a particular degree distribution.

As described above, the LDPC code is expressed using a parity check matrix. A higher-capacity memory is needed to store information on the parity check matrix of the LDPC code. Therefore, active research is being conducted on schemes for reducing the required memory capacity by efficiently storing the parity check matrix information.

For example, since an array code having a structured parity check matrix was proposed by Fan in 2000, various Quasi-Cyclic LDPC (QC-LDPC) codes based on a circulant permutation matrix have been developed to improve the memory efficiency.

The QC-LDPC code can be made by dividing the parity check matrix into a plurality of blocks and mapping a circulant permutation matrix or a zero matrix to each of the blocks.

FIG. 4 is a diagram illustrating a parity check matrix of a conventional QC-LDPC code.

With respect to the QC-LDPC code, efficient coding and efficient storage of the parity check matrix and performance improvement are considered. Referring to FIG. 4, a parity check matrix of the QC-LDPC code is made by dividing the full parity check matrix into a plurality of partial blocks and mapping a permutation matrix to each of the partial blocks. In FIG. 4, P represents an $N_s \times N_s$ permutation matrix, and a superscript $a_{pq}$ of the permutation matrix P has a value of $0 \leq a_{pq} \leq N_s - 1$ or $a_{pq} = \infty$.

In addition, p indicates that a corresponding permutation matrix is located in a $p^{th}$ row among the plurality of partial blocks of the parity check matrix, and q indicates that a corresponding permutation matrix is located in a $q^{th}$ column among the plurality of partial blocks of the parity check matrix. That is, $P^{a_{pq}}$ indicates a permutation matrix located in the point where a $p^{th}$ row and a $q^{th}$ column of the parity check matrix composed of the plurality of partial block cross each other. That is, the p and the q indicate the number of rows and the number of columns of the partial blocks corresponding to the information part in the parity check matrix.

The permutation matrix will now be described with reference to Equation (1) below.

$$P = \begin{bmatrix} 0 & 1 & 0 & & 0 \\ 0 & 0 & 1 & \cdots & 0 \\ \vdots & \vdots & \vdots & & \vdots \\ 0 & 0 & 0 & \cdots & 1 \\ 1 & 0 & 0 & & 0 \end{bmatrix} \quad (1)$$

As shown in Equation (1), the permutation matrix P is an $N_s \times N_s$ square matrix in which a weight of each of $N_s$ rows constituting the permutation matrix P is 1 and a weight of each of $N_s$ columns constituting the permutation matrix is also 1. Although a size of the permutation matrix P is expressed herein as $N_s \times N_s$, it should be noted that the size will also be expressed as $N_s$ for convenience, because the permutation matrix P is a square matrix.

In Equation (1), a permutation matrix $P^0$ with superscript $a_{pq} = 0$ indicates an identity matrix $I_{N_s \times N_s}$, and a permutation matrix $P\infty$ with superscript $a_{pq} = \infty$ indicates a zero matrix. Herein, $I_{N_s \times N_s}$ indicates an $N_s \times N_s$ identity matrix.

Short cycles in the LDPC code are the cause of performance degradation. That is, when there are many cycles with a short length in a factor graph of the LDPC code, information on a particular node belonging to the cycle with a short length, starting therefrom, returns after a small number of iterations. As the number of iterations increases, the information returns to the corresponding node more frequently, so that the information cannot be correctly updated, thereby causing deterioration in an error correction capability of the LDPC code. Therefore, it is necessary to increase the length of each cycle and reduce the number of short-length cycles if possible, in order to generate high-performance LDPC codes.

In order to efficiently use the LDPC code, the communication system should use an efficient shortening scheme to support various lengths of input information data bits using one parity check matrix. The shortening scheme reduces a coding rate by fixing the number of rows of the parity check matrix and decreasing the number of columns mapped to an information word, and is used for acquiring various coding rates for various codeword lengths. For example, the system that uses various lengths of input information data, using the parity check matrix of the same LDPC code, the system that uses an Adaptive Modulation and Coding (AMC) scheme using various coding rates, and the Hybrid Automatic Repeat reQuest (H-ARQ) system using various coding rates should all use the efficient shortening scheme.

FIG. 5 is a diagram illustrating a shortening scheme in a conventional communication system.

Referring to FIG. 5, reference numeral 500 indicates input information data, and a length of the input information data is variable. For example, while a length of the input information data needed to transmit packet data with a shorter length is several bits, a length of the input information data bits needed to transmit packet data with a longer length may be several thousands of bits or more. In order to generate the input information data with an LDPC code having a fixed input information word length, it is necessary to segment the input information data in an appropriate length. That is, because an input information word length for the LDPC code is fixed to K and an output information word length is fixed to N, it is necessary to generate the LDPC code by segmenting the input information data in a length K1 which is shorter than the input information word length K of the LDPC code, in order to transmit packet data with a shorter length.

Therefore, the communication system should use the shortening scheme in order to use the input information data having the length K1 which is shorter than the input information word length of the currently used LDPC code. For example, assuming that a length of the input information data is K1=2000 bits, an input information word length of the currently used LDPC code is K=512 bits, and an output codeword length is N=1024 bits, the input information data is segmented in 500 bits. In this manner, (N,K1)=(1012,500) codes are generated using the shortening scheme for the currently used LDPC code (see 502). The generated (N,K1)=(1012,500) codes are sequentially transmitted (see 504).

As described in FIG. 5, it is necessary to use the shortening scheme in order to transmit input information data having various lengths using a parity check matrix of a given LDPC code. In this case, because the number of bits to undergo shortening also increases, there is a need for a shortening scheme capable of providing excellent performance when deleting the various numbers of bits.

SUMMARY OF THE INVENTION

It is, therefore, an object of the present invention to provide an apparatus and method for transmitting/receiving signals using a QC-LDPC code supporting a variable coding rate in a communication system.

It is another object of the present invention to provide an apparatus and method for transmitting/receiving signals using a QC-LDPC code supporting a variable coding rate, with minimized coding complexity, in a communication system.

It is a further object of the present invention to provide an apparatus and method for transmitting/receiving signals using a QC-LDPC code that uses a shortening scheme available for input information data of various lengths, in a communication system.

According to the present invention, there is provided an apparatus for transmitting a signal in a communication system using an LDPC code. The apparatus includes a controller for determining the number of '0's to be inserted in information data according to a first coding rate to be applied when generating the information data into an LDPC code, and determining the number of '0's to be removed from the LDPC code, a '0' inserter for inserting '0' in the information data according to control of the controller, an LDPC encoder for generating the LDPC code by encoding the '0'-inserted signal according to a first parity check matrix, and a '0' remover for removing the inserted '0' from the LDPC code.

According to the present invention, there is provided a method for transmitting a signal in a communication system using an LDPC code. The method includes inserting '0' in information data according to a first coding rate to be applied when generating the information data into an LDPC code, generating the LDPC code by encoding the '0'-inserted signal according to a first parity check matrix, and removing the inserted '0' from the LDPC code.

BRIEF DESCRIPTION OF THE DRAWINGS

The above and other objects, features and advantages of the present invention will become more apparent from the following detailed description when taken in conjunction with the accompanying drawings in which:

FIG. 4 is a diagram illustrating a parity check matrix of a conventional QC-LDPC code;

FIG. 8 is a diagram illustrating a rate=½ parity check matrix according to the present invention;

FIG. 9 is a diagram illustrating a parity check matrix where the block columns of the parity check matrix of FIG. 8 are rearranged;

DETAILED DESCRIPTION OF THE PREFERRED EMBODIMENTS

Preferred embodiments of the present invention will now be described in detail with reference to the annexed drawings. In the following description, a detailed description of known functions and configurations incorporated herein has been omitted for the sake of clarity and conciseness.

The present invention discloses an apparatus and method for transmitting/receiving signals using a Quasi-Cyclic Low Density Parity Check (QC-LDPC) code supporting a variable coding rate in a communication system. That is, the present invention proposes an apparatus and method for transmitting/receiving signals using a QC-LDPC code supporting various coding rates in a communication system, wherein a length of the minimum cycle in a factor graph of the QC-LDPC code is maximized, coding complexity of the QC-LDPC code is minimized, and a degree distribution in the factor graph of the QC-LDPC code has an optimal distribution of 1.

Figures 1, 2:
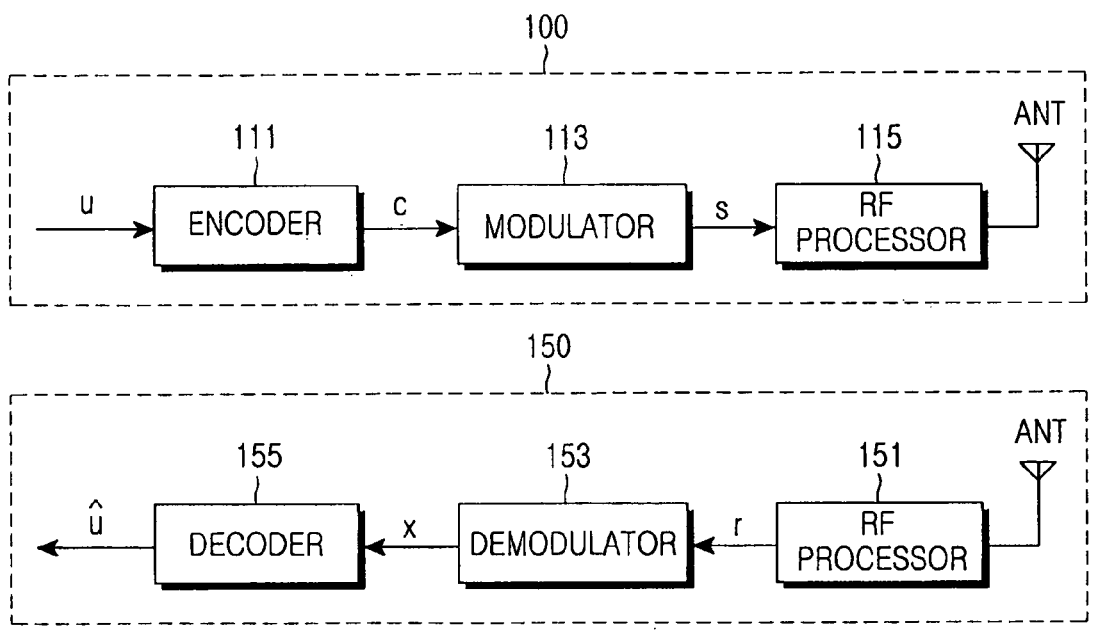
FIG. 1 is a diagram illustrating a structure of a transceiver in a conventional mobile communication system.
FIG. 2 is a diagram illustrating a parity check matrix of a conventional (8, 2, 4) LDPC code.
Figure 3:
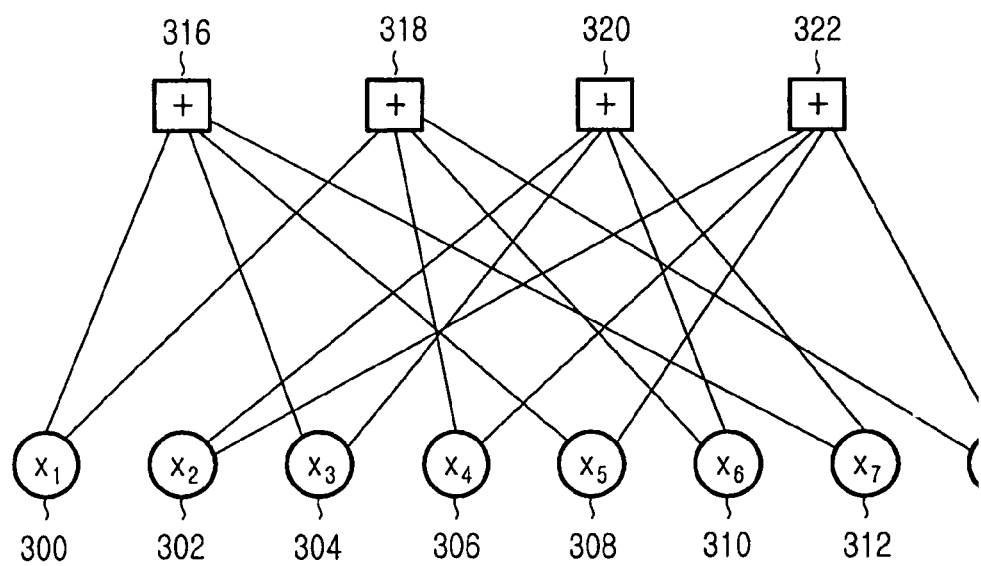
FIG. 3 is a diagram illustrating a factor graph of the (8, 2, 4) LDPC code of FIG. 2.
Figure 5:
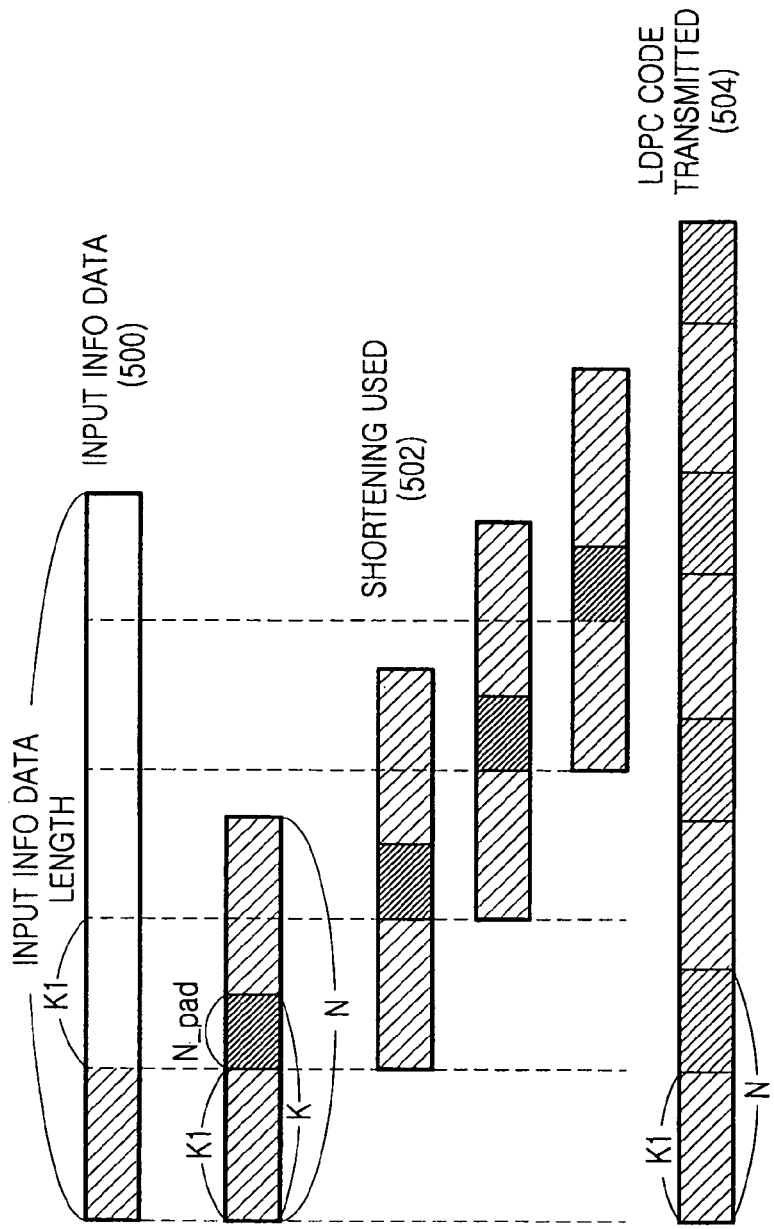
FIG. 5 is a diagram illustrating a shortening scheme in a conventional communication system.

In particular, the present invention proposes an apparatus and method for transmitting/receiving signals so as to support a variable coding rate using only the parity check matrix of one QC-LDPC code by using a shortening scheme for input information data of various lengths in a communication system. Although not separately illustrated and described, the novel QC-LDPC code supporting a variable coding rate can be applied to the structure of the transceiver described in FIG. 1. For convenience, the QC-LDPC supporting the variable coding rate will be referred to herein as a 'rate-compatible QC-LDPC code'.

The next generation communication system has developed into a packet service communication system, which is a system for transmitting burst packet data and bulk data to a plurality of mobile stations (MSs). In particular, various schemes such as a Hybrid Automatic Repeat reQuest (H-ARQ) scheme and an Adaptive Modulation and Coding (AMC) scheme have been proposed to increase the data throughput. Because the H-ARQ scheme and the AMC scheme support a variable coding rate, there is a need for a QC-LDPC code supporting various coding rates.

Design of the QC-LDPC code supporting various coding rates, i.e. a rate-compatible QC-LDPC code, is achieved through design of a parity check matrix, such as the design of the conventional LDPC code. However, in order to provide a rate-compatible QC-LDPC code with one codec, the communication system should include parity check matrixes capable of indicating a QC-LDPC code supporting a plurality of coding rates, in one parity check matrix. That is, the communication system should be able to support more than 2 coding rates using one parity check matrix. The shortening scheme is the typical scheme for enabling the communication system to support more than 2 coding rates using one parity check matrix.

The shortening scheme, which reduces a coding rate by fixing the number of rows of the parity check matrix and decreasing the number of columns mapped to an information word, is used for acquiring various coding rates for various codeword lengths.

Figure 6:
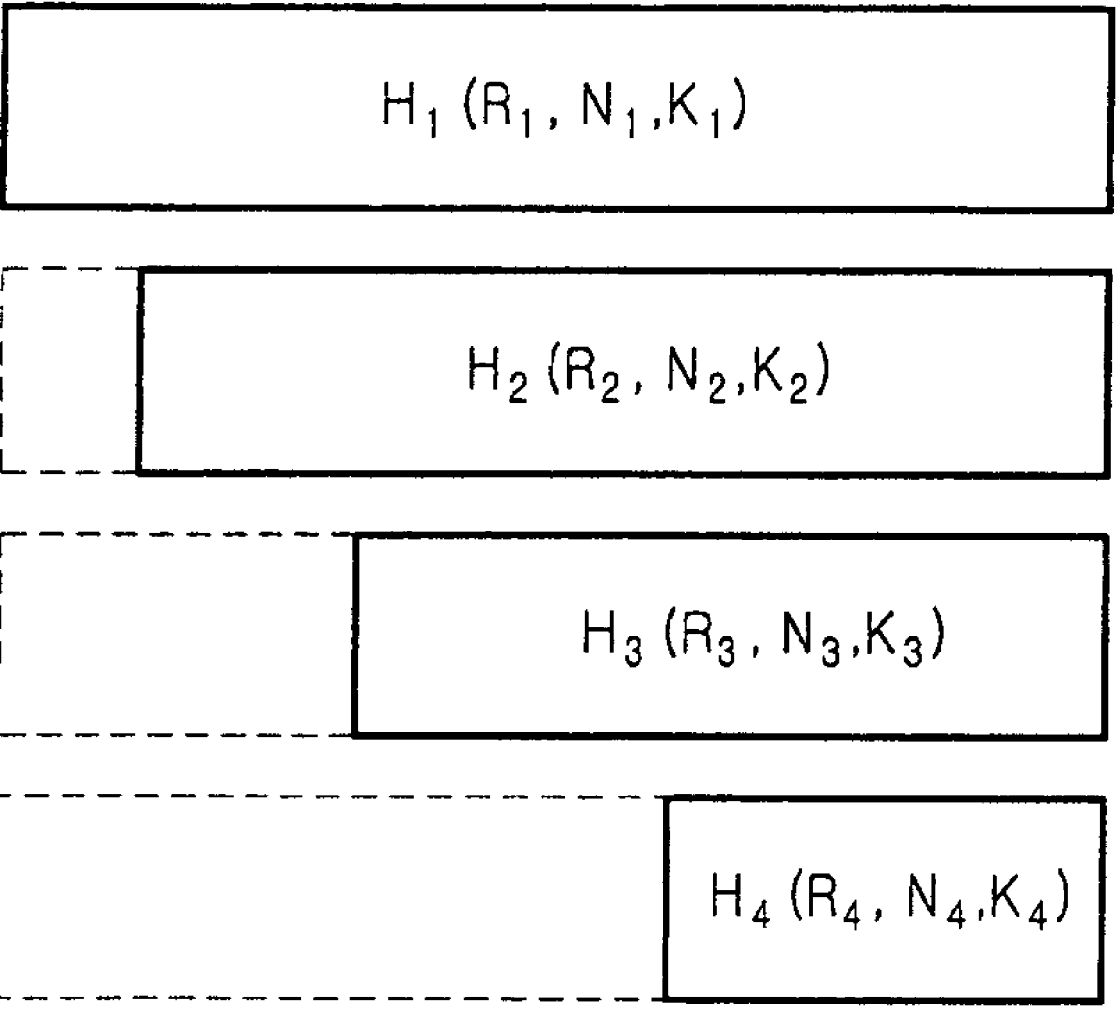
FIG. 6 is a diagram illustrating a process of generating a parity check matrix of a rate-compatible QC-LDPC code using a shortening scheme according to the present invention.

FIG. 6 is a diagram illustrating a process of generating a parity check matrix of a rate-compatible QC-LDPC code using a shortening scheme according to the present invention.

Referring to FIG. 6, $H_i(R_i, N_i, K_i)$ represents a parity check matrix of a rate-compatible QC-LDPC code having a coding rate $R_i$, a codeword length $N_i$ and an information word length $K_i$, and if i<j, then $N_i > N_j$ and $K_i > K_j$. A process of changing a QC-LDPC code corresponding to a parity check matrix of $H_1(R_1, N_1, K_1)$ (hereinafter '$(R_1, N_1, K_1)$-QC-LDPC code') into a QC-LDPC code corresponding to a parity check matrix of $H_2(R_2, N_2, K_2)$ (hereinafter '$(R_2, N_2, K_2)$-QC-LDPC code') can be simply analogized assuming that first $(K_1 - K_2)$ information word bits of the $(R_1, N_1, K_1)$-QC-LDPC code are all fixed to '0'. In addition, the $(R_1, N_1, K_1)$-QC-LDPC code other than the $(R_2, N_2, K_2)$-QC-LDPC code can also be simply generated by fixing $(K_1 - K_i)$ information word bits of the $(R_1, N_1, K_1)$-QC-LDPC code to '0'.

Therefore, in the operation of generating a parity check matrix of the rate-compatible QC-LDPC code using the shortening scheme as described in FIG. 6, a coding rate of the corresponding QC-LDPC code can be represented in Equation (2) by $$R_1 = \frac{K_1}{N_1}, R_i = \frac{K_i}{N_i} = \frac{K_1 - (K_1 - K_i)}{N_1 - (K_1 - K_i)} \quad (2)$$

If i<j, Equation (2) can be rewritten in Equation (3) as $$R_i - R_j = \frac{K_1 - (K_1 - K_i)}{N_1 - (K_1 - K_i)} - \frac{K_1 - (K_1 - K_j)}{N_1 - (K_1 - K_j)} \quad (3)$$
$$= \frac{(N_1 - K_1)(K_i - K_j)}{(N_1 - (K_1 - K_i))(N_1 - (K_1 - K_j))} > 0$$

It can be understood from Equation (3) that the coding rate is reduced when a parity check matrix is generated using the shortening scheme.

In addition, if it is assumed in FIG. 6 that the parity check matrix $H_1(R_1, N_1, K_1)$ has a full rank, even though the parity check matrix is generated using the shortening scheme, the number of rows in the parity check matrix generated using the shortening scheme remains constant. Therefore, the information word length is reduced while the parity length remains constant, so the coding rate is reduced. Generally, if a column mapped to the parity is removed from a preset parity check matrix, a codeword set is generated which is totally different from the codeword set generated when the column mapped to the parity is not removed, so the shortening scheme has a basic principle of removing the column mapped to the information word.

Figure 7:
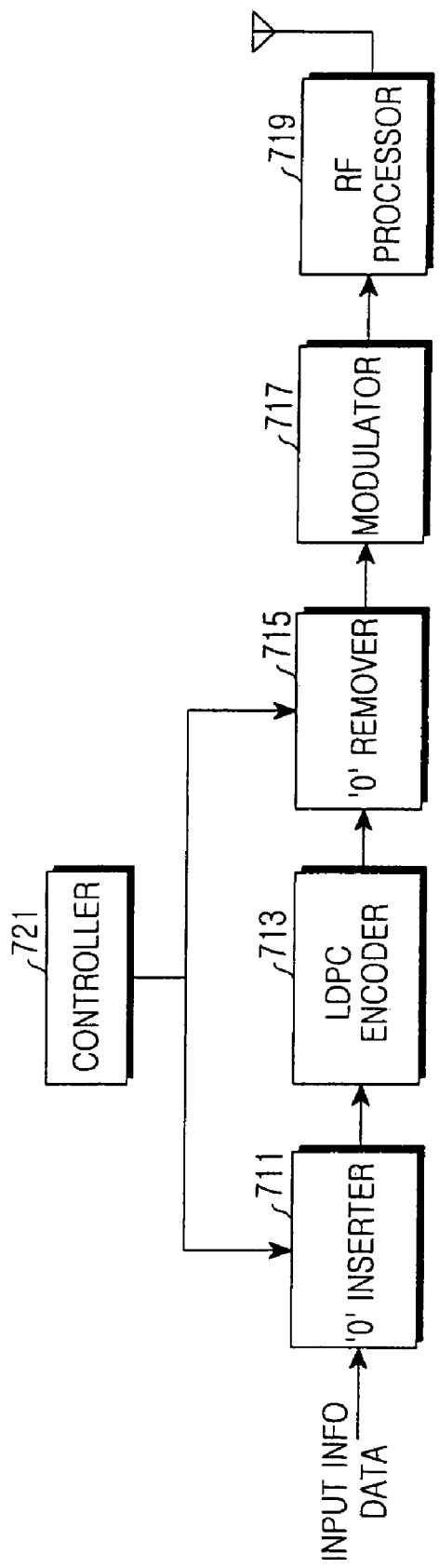
FIG. 7 is a diagram illustrating a structure of a transmitter for transmitting signals using a rate-compatible QC-LDPC code generated using a shortening scheme according to the present invention.

FIG. 7 is a diagram illustrating a structure of a transmitter for transmitting signals using a rate-compatible QC-LDPC code generated using a shortening scheme according to the present invention.

Referring to FIG. 7, the transmitter includes a '0' inserter 711, an LDPC encoder 713, a '0' remover 715, a modulator 717, a radio frequency (RF) processor 719 and a controller 721.

Before input information data is input to the transmitter, a corresponding coding rate and length information of the input information data are delivered to the controller 721. The controller 721 determines the number of bits to be removed from the input information data according to an input information word length of an LDPC code used in the LDPC encoder 713 depending on the coding rate, outputs the number of '0's needed to be inserted to the '0' inserter 711 according to the number of bits to be removed, and outputs the number of '0's inserted by the '0' inserter 711 to the '0' remover 715 to notify the number of '0's that the '0' remover 715 should be removed. Thereafter, the input information data is input to the '0' inserter 711.

The '0' inserter 711 inserts '0's in the input information data according to the number of '0's, output from the controller 721, and outputs the '0'-inserted bit stream to the LDPC encoder 713. For example, assuming that a length of input information data is 500 in a communication system using an (N,K)=(1024,512) LDPC code, the '0' inserter 711 inserts '0's of a length 12 in the input information data. The LDPC encoder 713 generates an LDPC codeword by encoding the signal output from the '0' inserter 711, and outputs the generated LDPC codeword to the '0' remover 715. There are various possible coding schemes for the LDPC encoder 713. However, since the coding schemes are not directly related to the object of the present invention, a detailed description thereof will be omitted.

The '0' remover 715, under the control of the controller 721, removes the '0' bits inserted by the '0' inserter 711, from the LDPC codeword output from the LDPC encoder 713, and outputs the '0'-removed LDPC codeword to the modulator 717. That is, because the non-input information data part, i.e. the inserted '0' bits, is not needed to be transmitted to a receiver, the '0' bits should be removed from the LDPC codeword.

The modulator 717 modulates the signal output from the '0' remover 715 with a preset modulation scheme, and outputs the modulated signal to the RF processor 719. The RF processor 719 RF-processes the signal output from the modulator 717, and transmits the RF-processed signal to the receiver via an antenna. The transmission of the input information data in the method described in FIG. 7 is equivalent in effect to an operation of removing columns of a parity check matrix, corresponding to the points where the '0' bits are inserted.

Because the parity check matrix generated using the shortening scheme has the coding rate and degree distribution totally different from that of the initially given parity check matrix, it is necessary to select the columns to be removed from the initially given parity check matrix, considering the degree distribution of the parity check matrix generated using the shortening scheme. To this end, it is important that the columns to be removed are selected such that the initially given parity check matrix before the use of the shortening scheme, i.e. a parent parity check matrix, and the parity check matrix after the use of the shortening scheme, i.e. a children parity check matrix, should both have the optimized degree distribution.

Generally, for a finite length, a high-coding rate QC-LDPC code exhibiting good performance is higher than a low-coding rate QC-LDPC code exhibiting good performance in terms of an average degree of a check node. Therefore, in order to generate a low-coding rate QC-LDPC code using the shortening scheme, it is necessary to provide the structure where the average degree of the check node is reduced after the use of the shortening scheme. In addition, because the use of the shortening scheme changes the degree distribution, in order to design a QC-LDPC code supporting various coding rates having a good noise threshold using a density evolution analysis scheme, the degree distribution of the parent parity check matrix and the degree distribution of the children parity check matrix generated using the shortening scheme should both be taken into consideration.

In the parity check matrix of the QC-LDPC code, all columns in each block column have the same degree distribution. Therefore, it is possible to select the columns, to be removed, of the parity check matrix in units of blocks in order to use the shortening scheme in the QC-LDPC code.

A description will now be made of a scheme for shortening columns of the parent parity check matrix so as to provide good performance in each length of input information data when the shortening scheme is used for the input information data of various lengths in the QC-LDPC code.

It will be assumed that the number of block columns of the parent parity check matrix is $N_B$, the number of block rows is $K_B$, and degrees of the columns used are $d_1, d_2, \ldots, d_{vmax}$. Herein, vmax denotes the maximum number of variable node degrees.

Step 1: The optimal degree distribution is calculated after removing 1 block column while using a degree of the column block used in the parent parity check matrix. That is, the optimal degree distribution is detected for the case where the number of block columns is $N_B-1$ and the degrees $d_1, d_2, \ldots, d_{vmax}$ are used.

Step 2: The degree of a block column which should be removed from the parent parity check matrix, is determined depending on the degree distribution detected in Step 1.

Step 3: After a corresponding block column is removed among the block columns having the degree determined in Step 2, a block column for providing the maximum cycle is selected. That is, when the number of block columns having the same degree is 2 or more, the block column where the columns belonging to the short cycle can be minimized in number after the corresponding block column is removed, is selected. This selection is performed because the LDPC code fundamentally has no short cycle in its parity check matrix as described above.

Step 4: If the number of same block columns belonging to the short cycle is 2 or more in Step 3, the block column where the distribution of the check node is uniform after the corresponding block column is removed, is selected. This is because the LDPC code fundamentally is high in performance when the degree distribution of the check node of the parity check matrix is uniform.

Step 5: If the number of same block columns belonging to the short cycle is 2 or more in Step 3, the block column where a threshold is maximized is selected by calculating the threshold of the parity check matrix after removing the corresponding block column. This is done to select the degree distribution having the maximum threshold, after calculating the threshold taking even the degree of the check node into account to precisely calculate the optimal degree distribution. In contrast, for the degree distribution detected in Step 1, only the degree distribution of the variable node used in the parent parity check matrix is considered.

Step 6: Steps 1 to 5 are repeatedly performed as many times as the number of blocks that should undergo shortening, in the parent parity check matrix. The block columns finally selected by repeatedly performing Steps 1 to 5 as many times as the number of blocks that should undergo shortening, in the parent parity check matrix, are sequentially arranged in the parent parity check matrix, and then sequentially shortened in the shortening process.

FIG. 8 is a diagram illustrating a rate=½ parity check matrix according to the present invention.

Referring to FIG. 8, in the parity check matrix, the number of block columns is $N_B=24$, the number of block rows is $K_B=11$, a block size is 72, and a length of an output codeword is N=1728. In this case, a total of 6 block columns to be removed should be selected for shortening a $1^{st}$ bit to a $432^{nd}$ bit. Herein, a set of the block columns of the parity check matrix will be expressed as $\{C_0, C_1, C_2, \ldots, C_{23}\}$.

First, the optimal degree distribution is detected when degrees of block columns use 2, 3 and 8 to select block columns to be removed to shorten a $1^{st}$ bit to a $72^{nd}$ bit, the number of block columns is 23, and the number of block rows is 12. Block columns where the degree is 8 as a detection result of the optimal degree distribution are selected for removal. A block column which maximizes the cycle when the corresponding block column is removed from the block columns with the degree=8. Assuming that the block column that maximizes the cycle when the corresponding block column is removed from the block columns with the degree=8 is denoted by $C_6$, the block column $C_6$ becomes the final block column to be removed to shorten the $1^{st}$ bit to the $72^{nd}$ bit.

Second, the optimal degree distribution is detected when degrees of block columns use 2, 3 and 8 to select block columns to be removed to shorten a $73^{rd}$ bit to a $144^{th}$ bit, the number of block columns is 22, and the number of block rows is 12. Block columns where the degree is 3 as a detection result of the optimal degree distribution are selected for removal. A block column which maximizes the cycle when the corresponding block column is removed from the block columns with the degree=3. Assuming that the block column that maximizes the cycle when the corresponding block column is removed from the block columns with the degree=3 is denoted by $C_2$, the block column $C_2$ becomes the final block column to be removed to shorten the $73^{rd}$ bit to the $144^{th}$ bit.

Similarly, the block columns to be removed to shorten a $145^{th}$ bit to a $432^{nd}$ bit are also selected by repeatedly performing the same operation as the operation of selecting the block columns to be removed to shorten the $1^{st}$ bit to the $72^{nd}$ bit and the operation of selecting the block columns to be removed to shorten the $73^{rd}$ bit to the $144^{th}$ bit. As a result, a block column $C_1$ is selected as the final block column to be removed to shorten a $145^{th}$ bit to a $216^{th}$ bit, a block column $C_{10}$ is selected as the final block column to be removed to shorten a $217^{th}$ bit to a $288^{th}$ bit, a block column $C_4$ is selected as the final block column to be removed to shorten a $289^{th}$ bit to a $360^{th}$ bit, and a block column $C_3$ is selected as the final block column to be removed to shorten a $361^{st}$ bit to a $432^{nd}$ bit.

After a total of 6 block columns to be removed to shorten the $1^{st}$ bit to the $432^{nd}$ bit are selected in this manner, the block columns arranged in the parity check matrix in order of $\{C_0, C_1, C_2, \ldots, C_{23}\}$ are rearranged in order of $\{C_6, C_2, C_1, C_{10}, C_4, C_3, C_0, C_5, C_7, C_8, C_9, C_{10}, \ldots, C_{23}\}$. That is, the block columns of the parity check matrix are rearranged in order of $\{C_6, C_2, C_1, C_{10}, C_4, C_3, C_0, C_5, C_7, C_8, C_9, C_{10}, \ldots, C_{23}\}$ by sequentially arranging a total of the 6 selected block columns in the original order of $\{C_0, C_1, C_2, \ldots, C_{23}\}$ beginning at the first block column of the parity check matrix.

In contrast, if the bits to be shortened in the shortening process are selected starting from the last bit of input information data, the block columns are rearranged in order of $\{C_0, C_5, C_7, C_8, C_9, C_{10}, \ldots, C_{23}, C_3, C_4, C_{10}, C_1, C_2, C_6\}$ by sequentially arranging a total of the 6 selected block columns in the original order of $\{C_0, C_1, C_2, \ldots, C_{23}\}$ beginning at the last block column of the parity check matrix.

In FIG. 8, numerals in the blocks indicate exponents of permutation matrixes mapped to corresponding blocks.

Figure 9:
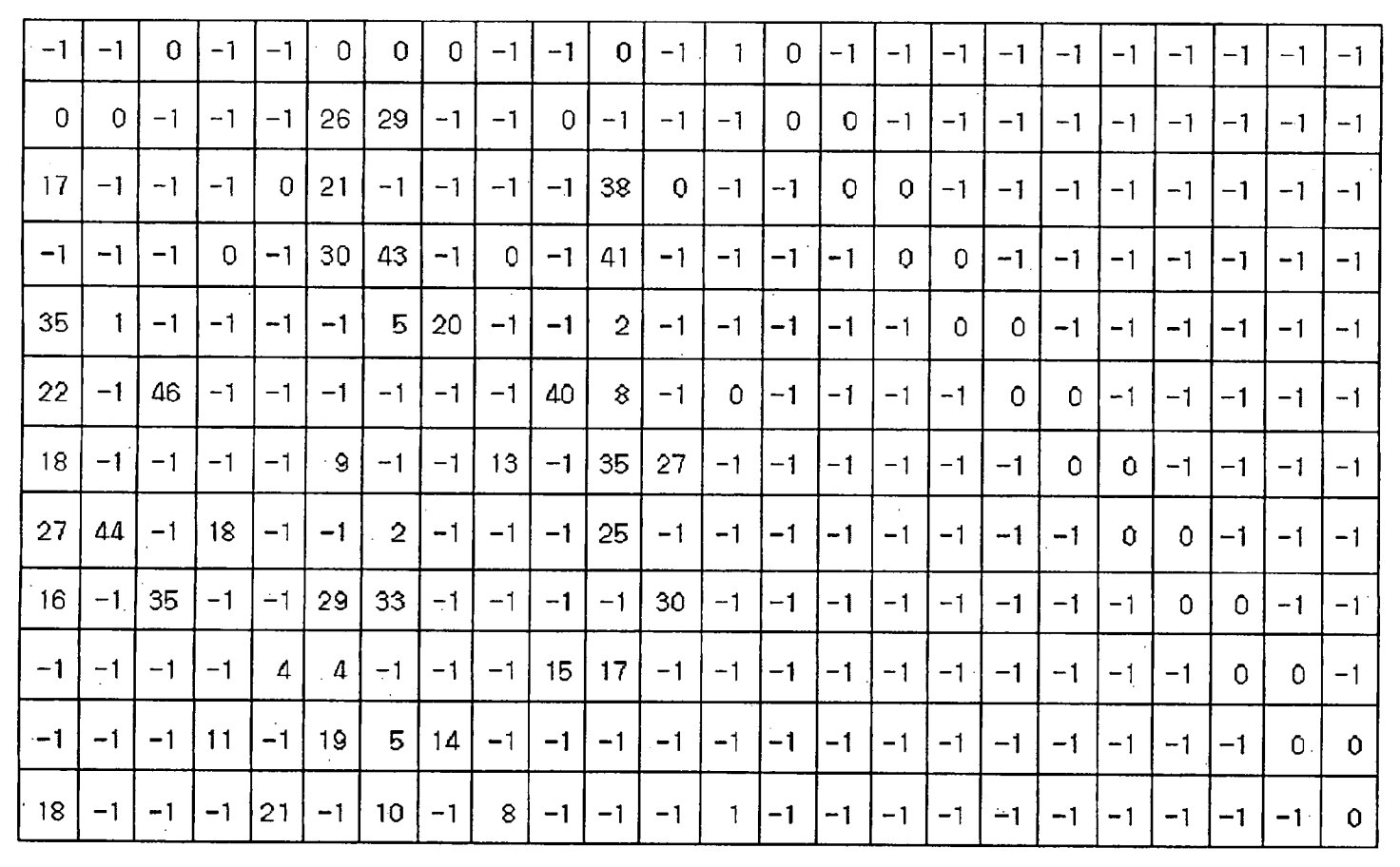

FIG. 9 is a diagram illustrating a parity check matrix where the block columns of the parity check matrix of FIG. 8 are rearranged.

As illustrated in FIG. 9 the parity check matrix of FIG. 8 composed of the block columns having the original order of $\{C_0, C_1, C_2, \ldots, C_{23}\}$ is generated as a new parity check matrix composed of the block columns having the order of $\{C_6, C_2, C_1, C_{10}, C_4, C_3, C_0, C_5, C_7, C_8, C_9, C_{10}, \ldots, C_{23}\}$ where a total of the 6 selected block columns are sequentially arranged from the first block column.

After the new parity check matrix is generated by rearranging the block columns of the parity check matrix of FIG. 8 in order of $\{C_6, C_2, C_1, C_{10}, C_4, C_3, C_0, C_5, C_7, C_8, C_9, C_{10}, \ldots, C_{23}\}$, the block columns are sequentially shortened beginning at the first block column in the shortening process. For example, in order to shorten 100 bits among 864 bits of input information data, the input data is set to d=$\{d_0, d_1, \ldots, d_{99}, d_{100}, \ldots, d_{863}\}$=$\{0, 0, \ldots, 0, d_{100}, \ldots, d_{863}\}$. This is done because as many '0' bits as the number of bits to be shortened are inserted. Also, in FIG. 9, numerals in the blocks indicate exponents of permutation matrixes mapped to a corresponding blocks.

Figure 10:
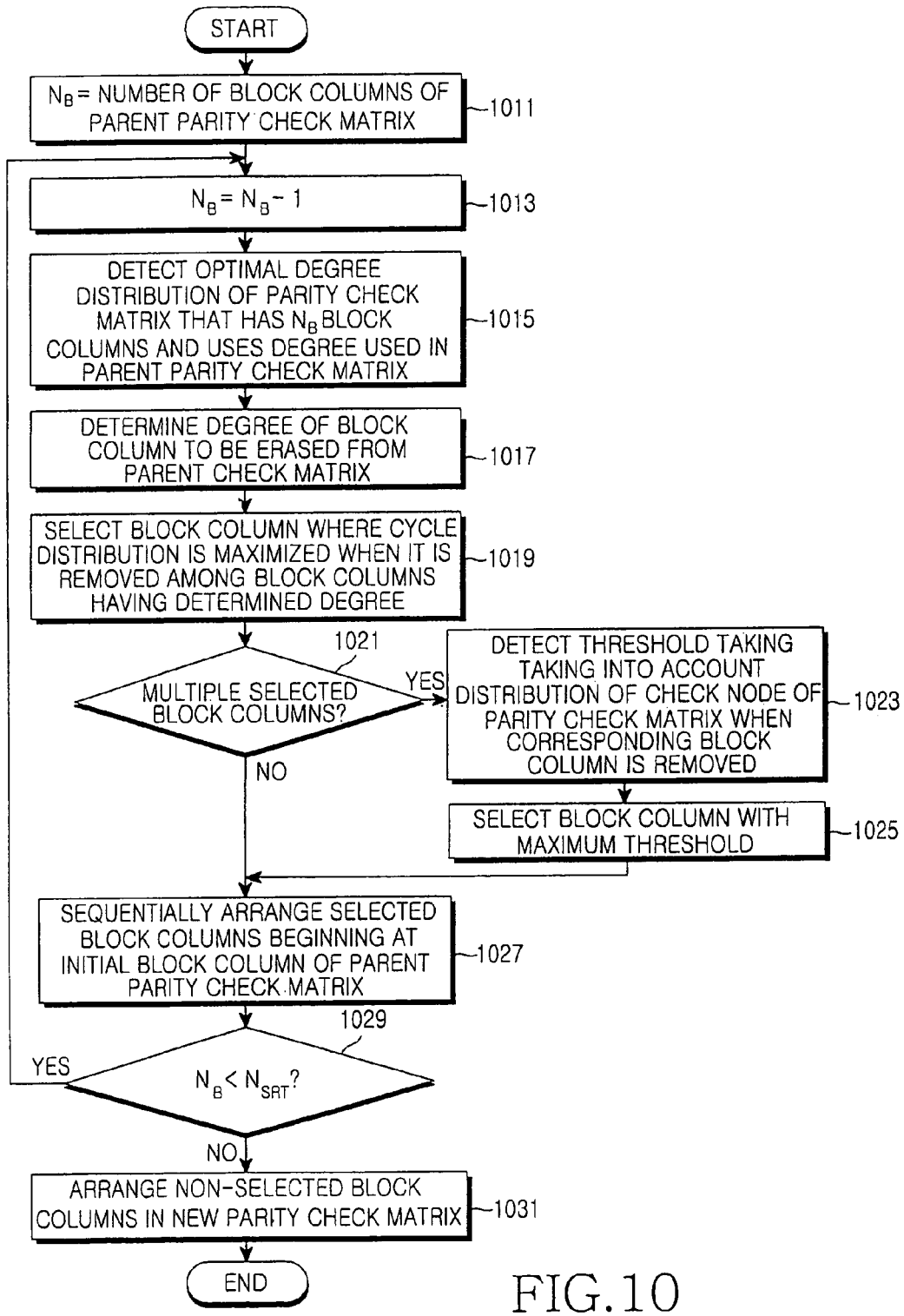
FIG. 10 is a flowchart illustrating a process of generating a parity check matrix of a rate-compatible QC-LDPC code according to a first embodiment of the present invention.

FIG. 10 is a flowchart illustrating a process of generating a parity check matrix of a rate-compatible QC-LDPC code according to a first embodiment of the present invention.

Referring to FIG. 10, in step 1011, a controller (not shown) of a communication system defines a parameter $N_B$ indicating the number of block columns of a parent parity check matrix. In step 1013, the controller substitutes a value $N_B-1$ determined by subtracting 1 from the parameter $N_B$ in the parameter $N_B$. The reason for substituting the value $N_B-1$ in the parameter $N_B$ is to indicate the number of block columns determined by subtracting 1 from the number of block columns of the parent parity check matrix in order to select the block columns to be removed from the parent parity check matrix.

In step 1015, the controller detects an optimal degree distribution of a parity check matrix that has $N_B$ block columns and uses the degree used in the parent parity check matrix. Herein, the optimal degree distribution of the parity check matrix that has $N_B$ block columns and uses the degree used in the parent parity check matrix is detected using a density evolution scheme. In step 1017, the controller determines a degree of the block column to be removed from the parent parity check matrix using the optimal degree distribution detected with the density evolution scheme.

In step 1019, the controller selects a block column where the cycle distribution is maximized when the corresponding block column is removed, among the block columns having the determined degree. If the number of block columns having the determined degree is 1, the block column is selected. That is, the controller selects the block column where the number of variable nodes belonging to the minimum cycle is minimized when the corresponding block column is removed, among the block columns having the determined degree, and removes the selected block column. This is because even the block columns having the same degree can differ in cycle distribution when the corresponding block columns are removed according to their arrangement method, and the LDPC code can generally provide good performance when the number of variable nodes belonging to the minimum cycle is minimized.

In step 1021, the controller determines whether there are multiple selected block columns, i.e. whether there are multiple block columns where the cycle distribution is maximized when they are removed from the block columns having the determined degree. If it is determined that there are not multiple selected block columns, the controller proceeds to step 1027. However, if it is determined that there are multiple selected block columns, the controller proceeds to step 1023 where it detects a threshold considering even the distribution of the check nodes of the parity check matrix for when the corresponding block column is removed. The threshold detection can also be achieved using the density evolution scheme.

In step 1025, the controller selects the block column where the detected threshold is maximized, among the plurality of the selected blocks. In step 1027, the controller sequentially arranges the selected block columns beginning at the first block column of the parent parity check matrix. In step 1029, the controller determines whether the number $N_B$ of block columns of the parent parity check matrix is less than the number $N_{SRT}$ of block columns of the children parity check matrix. Herein, the $N_{SRT}$ is the number of block columns of the corresponding children parity check matrix for when the input information data undergoes shortening. If it is determined that the $N_B$ is less than the $N_{SRT}$, the controller returns to step 1013. However, if it is determined that the $N_B$ is greater than or equal to the $N_{SRT}$, the controller proceeds to step 1031. In step 1031, the controller arranges the non-selected block columns in the new parity check matrix, and then ends the process. Herein, the non-selected block columns are arranged at the points following the selected block columns.

As described in FIG. 10, the first embodiment of the present invention generates a parity check matrix of a rate-compatible QC-LDPC code that can provide good performance even when various lengths undergo shortening in input information data using a parity check matrix.

Compared with the first embodiment, a second embodiment of the present invention generates a parity check matrix of a rate-compatible QC-LDPC code by generating a new parity check matrix that can provide good performance even when various lengths undergo shortening in input information data, instead of using a parity check matrix as discussed in the first embodiment. That is, the second embodiment considers a degree distribution of each block column of the parity check matrix of the rate-compatible QC-LDPC code. In designing a parity check matrix of a rate-compatible QC-LDPC code where various lengths can undergo shortening as described above, the most important factor is to design the parity check matrixes such that they both have a preferred threshold.

Assuming that the number of block columns used is $N_s < N_{s+1} < N_{s+2} < \ldots < N_B$, a parity check matrix is designed for the minimum block length $N_1$, and then a parity check matrix having a length exceeding the block column length $N_1$, is designed based on the designed parity check matrix.

Step 1: For a coding rate $R_s$ and the number $N_s$ of block columns, optimization of degree distribution is performed using the density evolution scheme. It will be assumed that a ratio of variable nodes with a degree j (for $1 \leq j \leq d_{v,max}$) to all variable nodes is $f_{1,j}$ in the degree distribution obtained as a result of the optimization. In this case, the $f_{1,j}$ and the degree distribution $\lambda_{1,j}$ of the edge can be mutually modified using the relationship defined in Equation (4) as $$f_{1,j} = \frac{\lambda_{1,j}/j}{\sum_k \lambda_{1,k}/k} \Leftrightarrow \lambda_{1,j} = \frac{j \cdot f_{1,j}}{\sum_k k \cdot f_{1,k}} \quad (4)$$

The check node can also be processed in the same manner as the variable node.

Step 2: For l (where $s+1 \leq l \leq B$), optimization of degree distribution is additionally performed from the degree distribution detected in the previous step under condition that $f_{l-1,j} \times N_{l-1}$ variable nodes with a degree j are included in all of $N_l$ variable nodes. The variable nodes and the check nodes are performed in the same manner.

The parity check matrix of the rate-compatible QC-LDPC code can be designed by performing the optimization scheme provided above in Steps 1 and 2. That is, the parity check matrix of the designed rate-compatible QC-LDPC code is an LDPC code in which while a parity length is constant to M through shortening according to input information data, the total block length is variable to $N_i$.

If the parity check matrix of the rate-compatible QC-LDPC code is designed using the shortening scheme such that it supports too many coding rates, the degrees of the check nodes increase, deteriorating the cycle characteristics. Therefore, the appropriate number of coding rates, a noise threshold desired to be acquired, and the cycle characteristic should be simultaneously considered.

Figure 11:
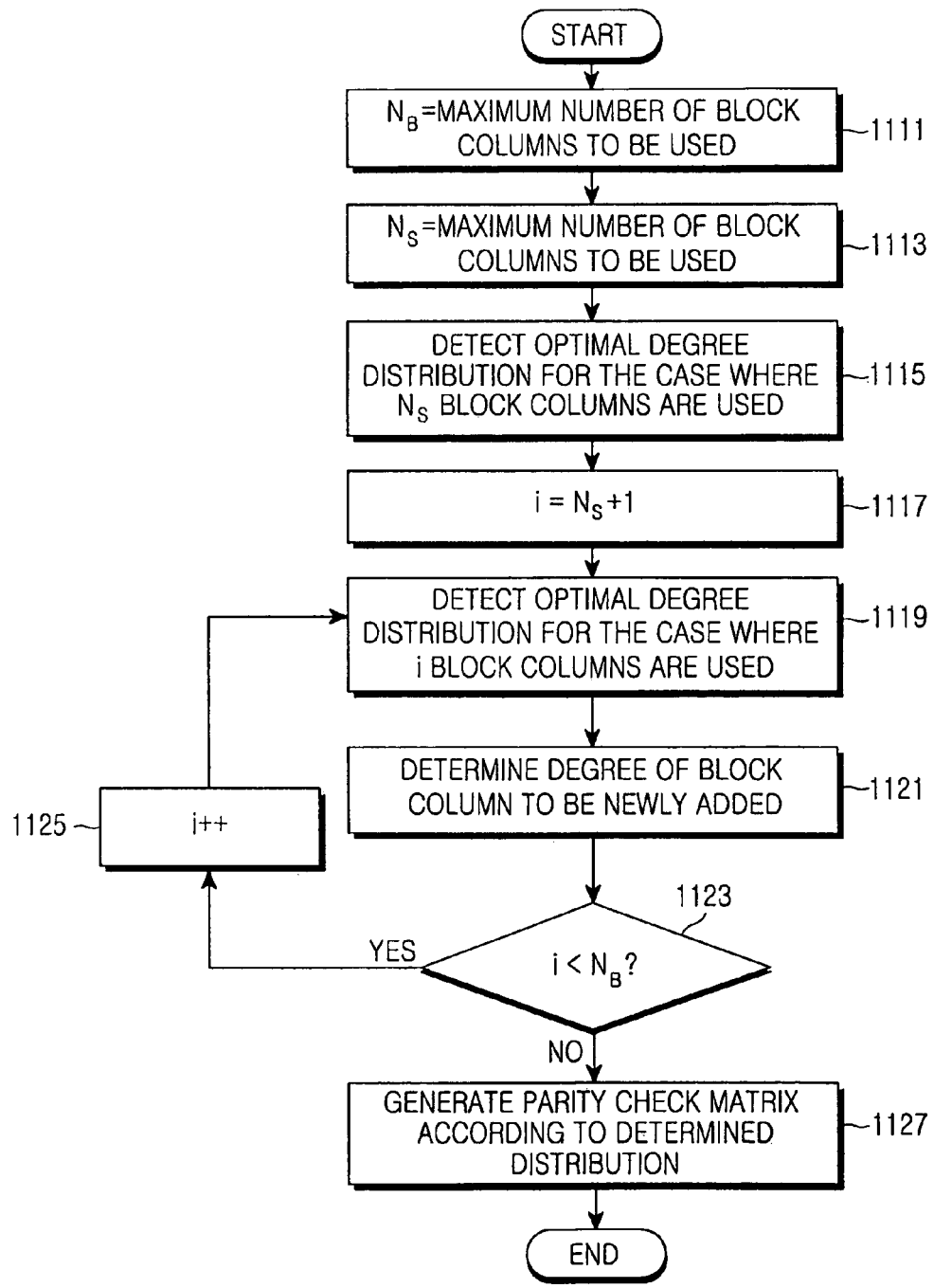
FIG. 11 is a flowchart illustrating a process of generating a parity check matrix of a rate-compatible QC-LDPC code according to a second embodiment of the present invention.

FIG. 11 is a flowchart illustrating a process of generating a parity check matrix of a rate-compatible QC-LDPC code according to a second embodiment of the present invention.

Referring to FIG. 11, in step 1111, a controller (not shown) of a communication system defines a variable $N_B$ indicating the maximum number of block columns to be used. In step 1113, the controller defines a variable $N_s$ indicating the minimum number of block columns to be used. In step 1115, the controller detects the optimal degree distribution for when $N_s$ block columns are used. Herein, the optimal degree distribution for when $N_s$ block columns are used is detected using the density evolution scheme. In step 1117, the controller defines a variable i, and substitutes a value $N_s+1$ determined by adding 1 to the variable $N_s$ in the variable i. Herein, the variable i is used to indicate a parity check matrix that uses i block columns by increasing it one by one.

In step 1119, the controller detects the optimal degree distribution for the case where i block columns are used. In step 1121, the controller determines a degree of a block column to be newly added. In step 1123, the controller determines whether the number i of currently used blocks is less than the maximum possible number $N_B$ of block columns. If it is determined that the number i of currently used blocks is less than the maximum possible number $N_B$ of block columns, the controller proceeds to step 1125. In step 1125, the controller increases the variable i by 1 (i++), and then returns to step 1119. However, if it is determined in step 1123 that the number i of currently used blocks is greater than or equal to the maximum possible number $N_B$ of block columns, the controller proceeds to step 1127 where it designs a parity check matrix according to the determined degree distribution, and then ends the process.

All codes of the LDPC code family can be decoded in a factor graph using a sum-product algorithm. A coding scheme of the LDPC code can be roughly classified into a bidirectional transfer scheme and a flow transfer scheme. When a decoding operation is performed using the bidirectional transfer scheme, each check node has its own node processor. As a result, complexity of the decoder increases in proportion to the number of the check nodes. However, because all nodes are simultaneously updated, the decoding speed significantly increases. Compared with the bidirectional transfer scheme, the flow transfer scheme updates information while passing through all nodes in the factor graph because there is only one node processor. Therefore, complexity of the decoder is low. However, as a size of the parity check matrix increases, i.e. as the number of nodes increases, the decoding speed decreases.

However, if the parity check matrix is generated in units of blocks like the rate-compatible QC-LDPC code supporting various coding rates proposed in the present invention, as many node processors as the number of blocks constituting the parity check matrix are used for decoding. Therefore, the flow transfer scheme is less complex than the bidirectional transfer scheme, and has a higher decoding speed than the bidirectional transfer scheme.

Figure 12:
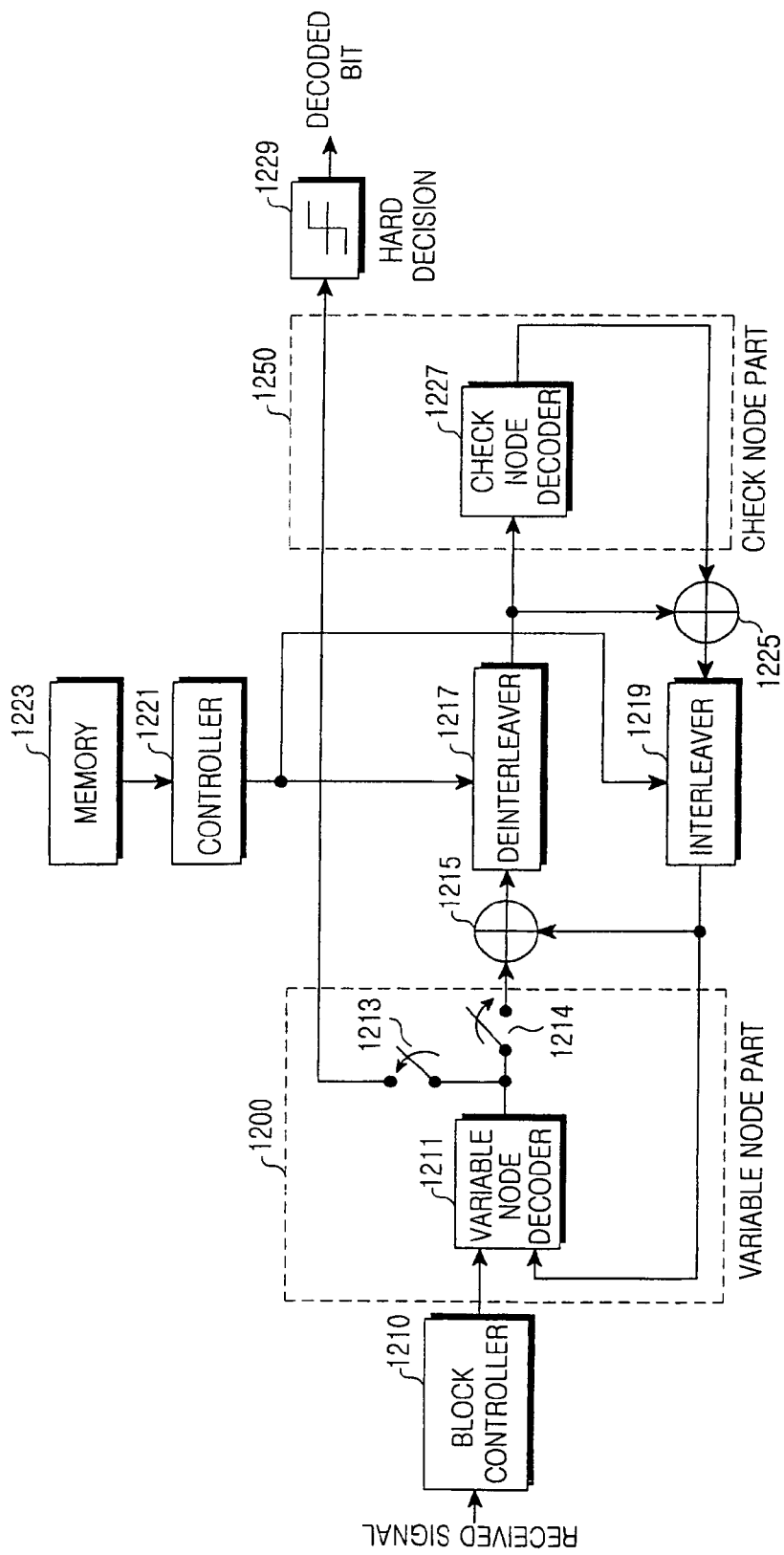
FIG. 12 is a diagram illustrating an internal structure of a decoding apparatus for a rate-compatible QC-LDPC code according to the present invention.

FIG. 12 is a diagram illustrating an internal structure of a decoding apparatus for a rate-compatible QC-LDPC code according to the present invention.

Referring to FIG. 12, the decoding apparatus for a rate-compatible QC-LDPC code includes a block controller 1210, a variable node part 1200, an adder 1215, a deinterleaver 1217, an interleaver 1219, a controller 1221, a memory 1223, an adder 1225, a check node part 1250 and a hard decision unit 1229. The variable node part 1200 includes a variable node decoder 1211 and switches 1213 and 1214, and the check node part 1250 includes a check node decoder 1227.

A signal received over a radio channel is input to the block controller 1210. The block controller 1210 adjusts the total block size by inserting a log likelihood value in a predetermined position as '0' or an infinite value according to a coding rate of the received signal, and then outputs the result to the variable node decoder 1211.

The variable node decoder 1211 calculates probability values of the signal output from the block controller 1210, updates the calculated probability values, and then outputs the updated probability values to the switches 1213 and 1214. Herein, the variable node decoder 1211 connects variable nodes to the decoding apparatus for a rate-compatible QC-LDPC code according to a preset parity check matrix, and performs an update operation having as many input/output values as the number of '1's connected to the variable nodes. The number of '1's connected to the variable nodes is equal to a weight of each of the columns constituting the parity check matrix. Therefore, an internal operation of the variable node decoder 1211 differs according to a weight of each of the columns constituting the parity check matrix. The switch 1214 is switched on to deliver the signal output from the block controller 1210 to the adder 1215 except when the switch 1213 is switched on.

The adder 1215 subtracts the signal output from the interleaver 1219 in a previous iterative decoding process, from the signal output from the variable node decoder 1211, and outputs the result to the deinterleaver 1217. If the decoding process is an initial decoding process, the output signal of the interleaver 1219 should be regarded as '0'.

The deinterleaver 1217 deinterleaves the signal output from the adder 1215 according to a preset deinterleaving scheme, and outputs the deinterleaved signal to the adder 1225 and the check node decoder 1227. The deinterleaver 1217 has an internal structure corresponding to a structure of the parity check matrix, because an output value of the interleaver 1219 corresponding to the deinterleaver 1217 is different from an input value thereof according to positions of the elements having a value of '1' in the parity check matrix.

The adder 1225 subtracts the output signal of the deinterleaver 1217 from the output signal of the check node decoder 1227 in the previous iterative decoding process, and outputs the result to the interleaver 1219. The check node decoder 1227 connects check nodes to the decoding apparatus for a block LDPC code according to a preset parity check matrix, and performs an update operation having as many input/output values as the number of '1's connected to the check nodes. The number of '1's connected to the check nodes is equal to a weight of each of the rows constituting the parity check matrix. Therefore, an internal operation of the check node decoder 1227 differs according to a weight of each of the rows constituting the parity check matrix.

The interleaver 1219 interleaves the signal output from the adder 1225 with a preset interleaving scheme under the control of the controller 1221, and outputs the interleaved signal to the adder 1215 and the variable node decoder 1211. Herein, the controller 1221 reads interleaving scheme-related information stored in the memory 1223, and controls the interleaving scheme of the interleaver 1219 and the deinterleaving scheme of the deinterleaver 1217 according to the information. Likewise, if the decoding process is an initial decoding process, the output signal of the deinterleaver 1217 should be regarded as '0'.

Highly-reliable decoding is performed without error by repeatedly performing the above processes, and after iterative decoding corresponding to a preset iteration is performed, the switch 1214 between the variable node decoder 1211 and the adder 1215 is switched off, and the switch 1213 between the variable node decoder 1211 and the hard decision unit 1229 is switched on to deliver the signal output from the variable node decoder 1211 to the hard decision unit 1229. The hard decision unit 1229 performs hard decision on the signal output from the variable node decoder 1211, and outputs the hard decision result. The output value of the hard decision unit 1229 is the finally decoded value.

As can be understood from the foregoing description, the present invention discloses a rate-compatible QC-LDPC code in a mobile communication system, thereby improving flexibility of the QC-LDPC code. In addition, the present invention generates an efficient parity check matrix, contributing to minimization of coding complexity of a rate-compatible QC-LDPC code. In particular, the present invention facilitates generation of a QC-LDPC code capable of supporting various coding rates, thereby minimizing hardware complexity.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for transmitting a signal in a communication system using a Low Density Parity Check (LDPC) code, the method comprising:
    inserting, by a '0' inserter, '0' in information data according to a first coding rate to be applied when generating the information data into an LDPC code;
    generating, by an LDPC encoder, the LDPC code by encoding the '0'-inserted signal according to a first parity check matrix;
    removing, by a '0' remover, the inserted '0' from the LDPC code;
    modulating the '0'-removed signal according to a modulation scheme; and
    transmitting the modulated signal.

2. The method of claim 1, wherein the first parity check matrix is used for generating a second parity check matrix supporting a second coding rate using a shortening scheme.

3. The method of claim 2, wherein the second parity check matrix includes a plurality of block columns, a first number of block columns among the plurality of block columns are mapped to the information data, and a second number of block columns that excludes the first number of block columns are mapped to a parity.

4. The method of claim 3, wherein the first parity check matrix is obtained by shortening a number of block columns of the first number of block columns of the second parity check matrix using the shortening scheme.

5. The method of claim 4, wherein the first parity check matrix is generated by detecting an optimal degree distribution after removing a number of block columns while using a degree of block columns used in the second parity check matrix, according to the number of block columns to be shortened according to the first coding rate, determining a degree of a block column to be removed according to the detected optimal degree distribution, selecting a block column where a cycle is maximized after the corresponding block column is removed among the block columns having the determined degree, sequentially arranging the selected block columns according to the number of the block columns to be shortened beginning at an initial block column, and arranging block columns except for the selected block columns among the block columns of the second parity check matrix in a position following the arranged block columns.

6. The method of claim 5, wherein the first parity check matrix is generated by selecting a block column where distribution of a check node is uniform among a plurality of block columns where a cycle is maximized after a corresponding block column is removed, if there are a number of block columns where a cycle is maximized after the corresponding block column is removed among the block columns having the determined degree.

7. The method of claim 5, wherein the first parity check matrix is generated by detecting thresholds considering a degree of a check node for each of a plurality of block columns where a cycle is maximized after the corresponding block columns are removed, and selecting a block column having a maximum threshold among the detected thresholds, if there are a number of block columns where a cycle is maximized after the corresponding block column is removed among the block columns having the determined degree.

8. The method of claim 1, wherein the first parity check matrix is generated by defining a maximum number and a minimum number of block columns to be used, detecting an optimal degree distribution for a case where the minimum number of block columns are used, detecting an optimal degree distribution for a case where an increased number of block columns are used while increasing the minimum number by a value, determining a degree of a block column to be newly added, and generating the first parity check matrix according to the determined degree distribution if the number of block columns currently used is greater than or equal to the maximum number.

9. The method of claim 8, wherein the degree distribution is optimized using a density evolution scheme.

10. An apparatus for transmitting a signal in a communication system using a Low Density Parity Check (LDPC) code, the apparatus comprising:
a controller for determining a number of '0's to be inserted in information data according to a first coding rate to be applied when generating the information data into an LDPC code, and determining a number of '0's to be removed from the LDPC code;
a '0' inserter for inserting '0' in the information data according to control of the controller;
an LDPC encoder for generating the LDPC code by encoding the '0'-inserted signal according to a first parity check matrix;
a '0' remover for removing the inserted '0' from the LDPC code;
a modulator for modulating the '0'-removed signal according to a modulation scheme; and
a transmitter for transmitting the modulated signal.

11. The apparatus of claim 10, wherein the first parity check matrix is used for generating a second parity check matrix supporting a second coding rate using a shortening scheme.

12. The apparatus of claim 11, wherein the second parity check matrix includes a plurality of block columns, a first number of block columns among the plurality of block columns are mapped to the information data, and a second number of block columns that excludes the first number of block columns are mapped to a parity.

13. The apparatus of claim 12, wherein the first parity check matrix is obtained by shortening a number of block columns of the first number of block columns of the second parity check matrix using the shortening scheme.

14. The apparatus of claim 13, wherein the first parity check matrix is generated by detecting an optimal degree distribution after removing a number of block columns while using a degree of block columns used in the second parity check matrix, according to the number of block columns to be shortened according to the first coding rate, determining a degree of a block column to be removed according to the detected optimal degree distribution, selecting a block column where a cycle is maximized after the corresponding block column is removed among the block columns having the determined degree, sequentially arranging the selected block columns according to the number of the block columns to be shortened beginning at an initial block column, and arranging block columns except for the selected block columns among the block columns of the second parity check matrix in a position following the arranged block columns.

15. The apparatus of claim 14, wherein the first parity check matrix is generated by selecting a block column where distribution of a check node is uniform among a plurality of block columns where a cycle is maximized after a corresponding block column is removed, if there are a number of block columns where a cycle is maximized after the corresponding block column is removed among the block columns having the determined degree.

16. The apparatus of claim 14, wherein the first parity check matrix is generated by detecting thresholds considering a degree of a check node for each of a plurality of block columns where a cycle is maximized after the corresponding block columns are removed, and selecting a block column having a maximum threshold among the detected thresholds, if there are a number of block columns where a cycle is maximized after the corresponding block column is removed among the block columns having the determined degree.

17. The apparatus of claim 10, wherein the first parity check matrix is generated by defining a maximum number and a minimum number of block columns to be used, detecting an optimal degree distribution for a case where the minimum number of block columns are used, detecting an optimal degree distribution for a case where an increased number of block columns are used while increasing the minimum number by a value, determining a degree of a block column to be newly added, and generating the first parity check matrix according to the determined degree distribution if the number of block columns currently used is greater than or equal to the maximum number.

18. The apparatus of claim 17, wherein the degree distribution is optimized using a density evolution scheme.

* * * * *